United States Patent
Tajul et al.

(10) Patent No.: US 7,677,765 B2
(45) Date of Patent: Mar. 16, 2010

(54) LIGHT EMITTING DEVICE HAVING A METAL CAN PACKAGE FOR IMPROVED HEAT DISSIPATION

(75) Inventors: Arosh Baroky Tajul, Penang (MY); Janet BeeYin Chua, Perak (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 272 days.

(21) Appl. No.: 11/454,653

(22) Filed: Jun. 15, 2006

(65) Prior Publication Data

US 2007/0291490 A1 Dec. 20, 2007

(51) Int. Cl.
*F21V 29/00* (2006.01)

(52) U.S. Cl. .................. 362/294; 362/255; 362/256; 362/249.02; 362/800; 362/218; 362/373; 257/98; 257/99; 257/100

(58) Field of Classification Search ............... 362/218, 362/294, 373, 255, 256, 249.02, 800; 361/707, 361/719; 257/79, 99, 98, 100

See application file for complete search history.

(56) References Cited

U.S. PATENT DOCUMENTS

| | | | | |
|---|---|---|---|---|
| 5,635,754 A | * | 6/1997 | Strobel et al. .............. | 257/659 |
| 6,480,389 B1 | * | 11/2002 | Shie et al. ................... | 361/707 |
| 6,936,855 B1 | * | 8/2005 | Harrah ........................ | 257/88 |
| 7,183,587 B2 | * | 2/2007 | Negley et al. ................ | 257/99 |
| 7,196,354 B1 | * | 3/2007 | Erchak et al. ................ | 257/79 |
| 2002/0057565 A1 | * | 5/2002 | Seo ............................. | 362/84 |
| 2005/0073846 A1 | * | 4/2005 | Takine ........................ | 362/296 |
| 2005/0230691 A1 | * | 10/2005 | Amiotti et al. ............... | 257/79 |
| 2006/0166407 A1 | * | 7/2006 | Kaushal et al. .............. | 438/115 |

* cited by examiner

*Primary Examiner*—Sandra L O'Shea
*Assistant Examiner*—Jessica L McMillan

(57) ABSTRACT

A light emitting device having an hermetically sealed package that includes a light source positioned in a metal can container on which is placed an optically-transparent cover. An enclosed space formed by the metal can container and the optically-transparent cover may be filled with an inert, heat-conducting gas or liquid and the inner surface of the metal can container may be coated with a high-reflector material that prevents absorption of the light emitted by the light source. A method of producing a light-emitting device having an hermetically-sealed package and a method of dissipating heat from a light-emitting device having an hermetically-sealed package is also provided.

16 Claims, 3 Drawing Sheets

LIGHT EMITTING DEVICE HAVING A METAL CAN PACKAGE FOR IMPROVED HEAT DISSIPATION

BACKGROUND OF THE INVENTION

Light emitting diodes ("LEDs") are, in general, miniature semiconductor devices that employ a form of electroluminescence resulting from the electronic excitation of a semiconductor material to produce visible light. Initially, the use of these devices was limited mainly to display functions on electronic appliances and the colors emitted were red and green. As the technology has improved, LEDs have found a wide range of new uses and applications.

In the manufacturing process, the LEDs may be mounted on a substrate that may include an integrated circuit ("IC" or "chip") or a printed circuit board ("PCB"), and may also have terminals or leads attached. It is appreciated by those skilled in the art that each of the LEDs or substrate may be described as a "die," which refers to an individual monolithic device and therefore may be interchangeably used with the terms "IC" and "chip." The LEDs may be mounted using conductive paste because the substrate may form one of the two diode connections. The LEDs may also be wire bonded to an interconnection pattern. Depending on how the LEDs are internally connected in the package, LEDs may be referred to as a Common Anode or Common Cathode type, with the former being predominant. There are also versions where all LED connections have been wire bonded out.

An LED may be positioned in a concave base cavity adapted to provide an initial focus for the light output from the LED. The LED may be provided with anode and cathode bonding wires that place the LED in communication with an electrical circuit for supplying a bias voltage to the LED. The LED may be encapsulated in a material intended to protect the LED from external contaminants and from being physically damaged or dislodged, and which may form part of a lens system for further focusing the light output of the LED. A substrate on which the LED rests may include a metallized portion underneath the LED that may serve to dissipate heat from the LED.

Along with light output, LED devices also generate heat. Despite typical design features of LED devices including those summarized above, LED devices are commonly prone to damage caused by the buildup of heat generated from within the devices, as well as heat from sunlight in the case of outside lighting applications. Although metallized LED substrates are useful design elements that may be incorporated in LED devices and can serve to dissipate heat, these elements are often inadequate to maintain reasonably moderate temperatures in the devices that will ensure adequate maximum drive current without compromising the reliability of the package. For example, the semiconductor junction temperature, which increases as more current is applied, may be high enough to cause the encapsulant placed in the LED to expand and contract, thus causing displacement of the wire bonding and resulting in premature wear-out and even failure of the LED. Excessive heat buildup can also cause deterioration of the materials in the LED devices, such as the encapsulants for the LED.

Epoxy and silicone polymers, commonly used in LED encapsulant formulations, generally are poor heat conductors and are not sufficiently resistant to the high temperatures that often are generated inside LED devices during operation. These polymers can develop substantially reduced light transmissivity as they undergo heat degradation caused by such high temperatures. This reduced light transmissivity can increase absorbance by the LED devices themselves of light at wavelengths that are intended to be included in light output from the devices. This light absorbance can be pronounced at near-ultra-violet wavelengths, and can cause commensurate declines in the light output quality and intensity from an LED device.

An additional problem that is exacerbated by excessive heat in the LED device is that of Coefficient of Thermal Expansion ("CTE") mismatch between the encapsulant material, the die, and the bonding wires. In general, thermal stresses may be caused by the differential expansion of the die and its substrate, the encapsulant material and the bonding wires, and the encapsulant material and the die. One approach is to match the CTE of the encapsulant material and the bonding wires to reduce thermal stresses and prevent displacement of the wire bonding. Also the encapsulant material may be chosen for either a rigid or a compliant package, which is also a factor in reducing thermal stresses.

Consequently, there is a continuing need to provide new LED device structures having improved capability to dissipate heat in order to protect against the degradation of certain elements of the LED device.

SUMMARY

A light emitting device having an hermetically sealed package ("LED-HSP") is described. The hermetically sealed package of the LED-HSP may include a metal can container on which is placed a glass cover with a metal rim. The enclosed volume formed by the metal can container and the glass cover may be filled with an inert, heat conducting gas or liquid and the inner surface of the enclosed volume may be coated with a high-reflector material, such as plated silver or gold, polished or sputtered aluminum, or polished nickel, that prevents absorption of the light emitted by the light source in the LED-HSP.

At the base of the enclosed volume, there may be a concave base cavity, for example, a reflector cup, in which the light source, for example, a light-emitting diode ("LED"), is placed. The light source may be a flip chip die or an LED die electrically connected with bonding wires. The LED-HSP may also include a collimating light pipe for light collimating purposes, as well as a Fresnel lens or a dome-shaped lens incorporated into the glass cover for additional light collimation.

In addition, a method of producing a light emitting device having a hermetically-sealed package for improved heat dissipation properties is disclosed. The method may include forming an hermetically sealed package with a light source encapsulated in an inert, heat conducting gas or liquid. The method may also include forming a light emitting device having a substrate including a concave base housing, positioning a light source within the concave base cavity, placing an assembly that includes the substrate, the concave base housing, and the light source in a metal can container, coating an inner surface of the metal can container with a reflective coating, forming an hermetically sealed package by placing a glass cover on the hermetically sealed package, and filling the hermetically sealed package with an inert, heat conducting gas or liquid, whereby the heat generated by the light source is dissipated through the inert, heat conducting gas or liquid and the metal can container.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of various implementations, reference is made to the accompanying drawings that form a part of this disclosure, and which show, by way of illustration, specific implementations in which the invention may be practiced. Other implementations may be utilized and structural changes may be made without departing from the scope of the present invention.

Figure 1:
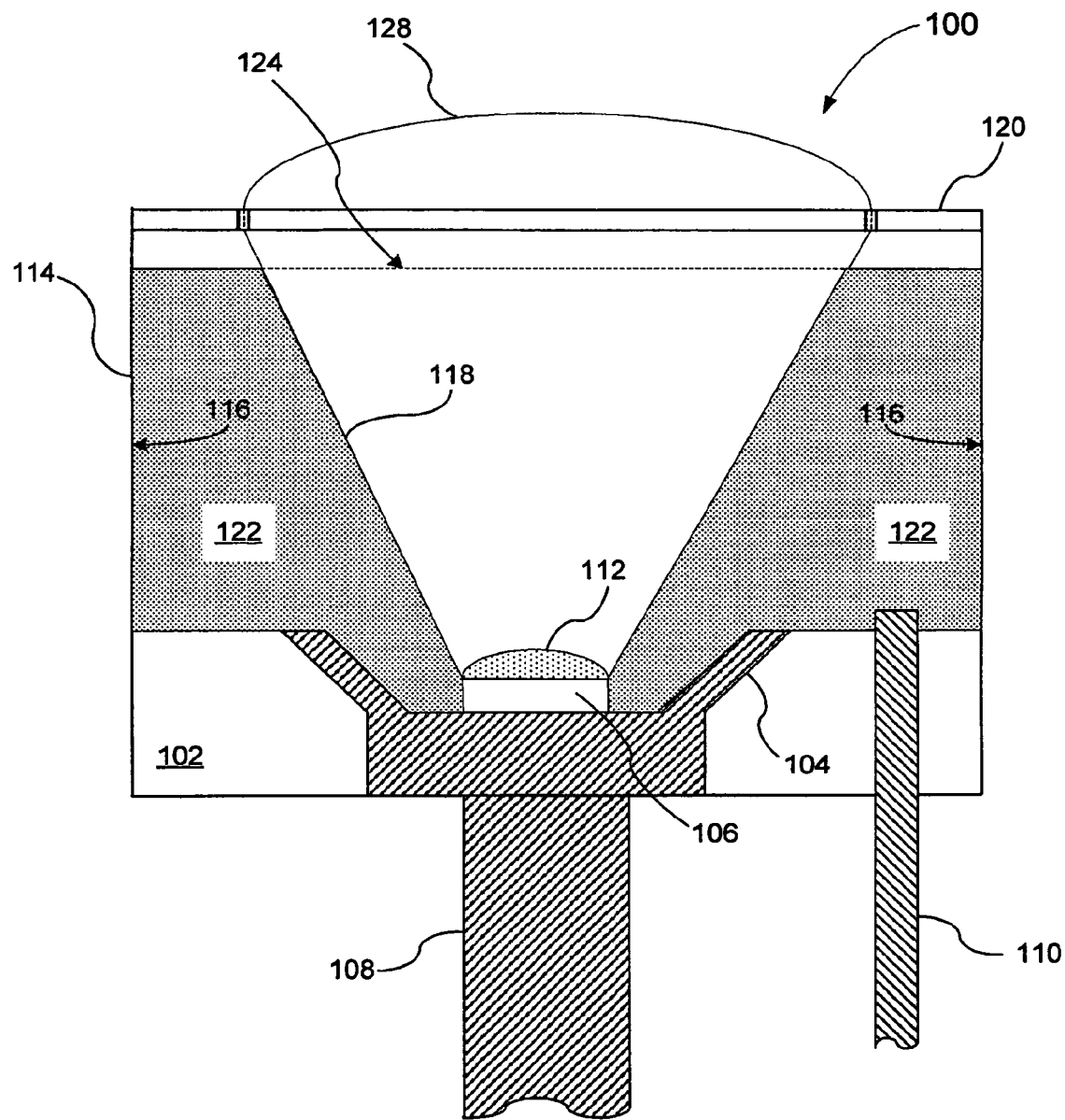
FIG. 1 shows a cross-sectional side view illustrating an example of an implementation of a light emitting device utilizing a metal can package to house a light source and that is hermetically sealed and may be filled with an inert, heat-conducting gas or liquid.

In FIG. 1, a cross-sectional side view illustrating an example of an implementation of a light emitting device that utilizes an hermetically sealed metal can package to house a light source is shown. The metal can package may be filled with an inert, heat conducting gas or liquid. The light emitting device having a hermetically sealed package ("LED-HSP") 100 includes a substrate 102 having a concave base cavity 104 in which a light source 106, such as a light emitting diode ("LED"), may be placed. As an example, the substrate 102 may be a metal base that may function as a heat sink and may also include the concave base housing 104 that supports the light source 106.

The LED-HSP 100 may also include a mount lead 108 and an inner lead 110, with the concave base cavity 104 being supported by the mount lead 108. In FIG. 1, the light source 106 may be a flip chip microelectronic assembly in which case, the electrical connection to the light emitting device 106 is made through connections to conductive bumps (not shown) on the underside of the light source 106. The LED-HSP 100 may also include an optical gel 112 applied to the top surface of the light source 106, which may be used to improve the extraction of light from the light source 106 by matching the refractive index of the optical gel 112 to that of the light source 106.

The substrate 102, the concave base cavity 104, and the light source 106 are positioned at the bottom of a metal can package 114, which may include any of the following metal can packages: TO-3, TO-5, TO-8, TO-18, TO-39, TO-46, TO-52, TO-56, TO-66, TO-71, TO-72, TO-78, TO-99, TO-100, TO-237, and TO-257. In addition, the interior surfaces 116 of the metal can package 114 may be coated with a high-reflective material, such as silver, gold, sputtered aluminum, nickel-palladium, and other similar materials.

The LED-HSP 100 may also include a collimating light pipe assembly 118, which may be made of a clear optical grade acrylic or polycarbonate material that may be used to transmit the light from the light source 106 to the top of the LED-HSP 100. In one example implementation, the collimating light pipe assembly 118 may be solid device, and in another, the collimating light pipe assembly 118 may be in the form of a tube, cylinder, or cone, that is, a device with a hollow interior and an interior surface. In the case of a collimating light pipe assembly 118 that is a solid device, the collimating light pipe assembly 118 may also include a coating of a high-reflective material, such as silver, gold, sputtered aluminum, nickel-palladium, and or similar materials, on its exterior surface. In the case of a collimating light pipe assembly 118 that has a hollow interior, the reflective coating may be applied to the interior surface.

At the top of the LED-HSP 100, an optically-transparent cover 120 is positioned at the top of the metal can package 114. The optically-transparent cover 120 may be made of glass or any polymeric transparent substrate, and may also have a metal rim. Together, the optically-transparent cover 120, the metal can package 114, and the substrate 102 may form an enclosed space that may be hermetically sealed. An inert, heat conducting liquid 122 may be injected into the enclosed space formed by the optically-transparent cover 120, the metal can package 114, the substrate 102, and the collimating light pipe assembly 118. In the case of an inert liquid, the enclosed space is filled to the fill-line 124, to allow for thermal expansion. To maximize the light extraction from the LED-HSP 100, the refractive index of the optically-transparent cover 120 may be matched to that of the collimating light pipe assembly 118.

The LED-HSP 100 may also include a lens 128 that may be attached to the optically-transparent cover 120. In another implementation, a lens 128 may be incorporated into the optically-transparent cover 120 such that the lens 128 and the optically-transparent cover 120 constitute a single integrated unit. The lens may be used to further collimate the light from the light source 106 and may be made of glass, plastic, or other optically-transparent material. Also, the lens 128 may be a dome-shaped or convex lens or a Fresnel lens.

Figure 2:
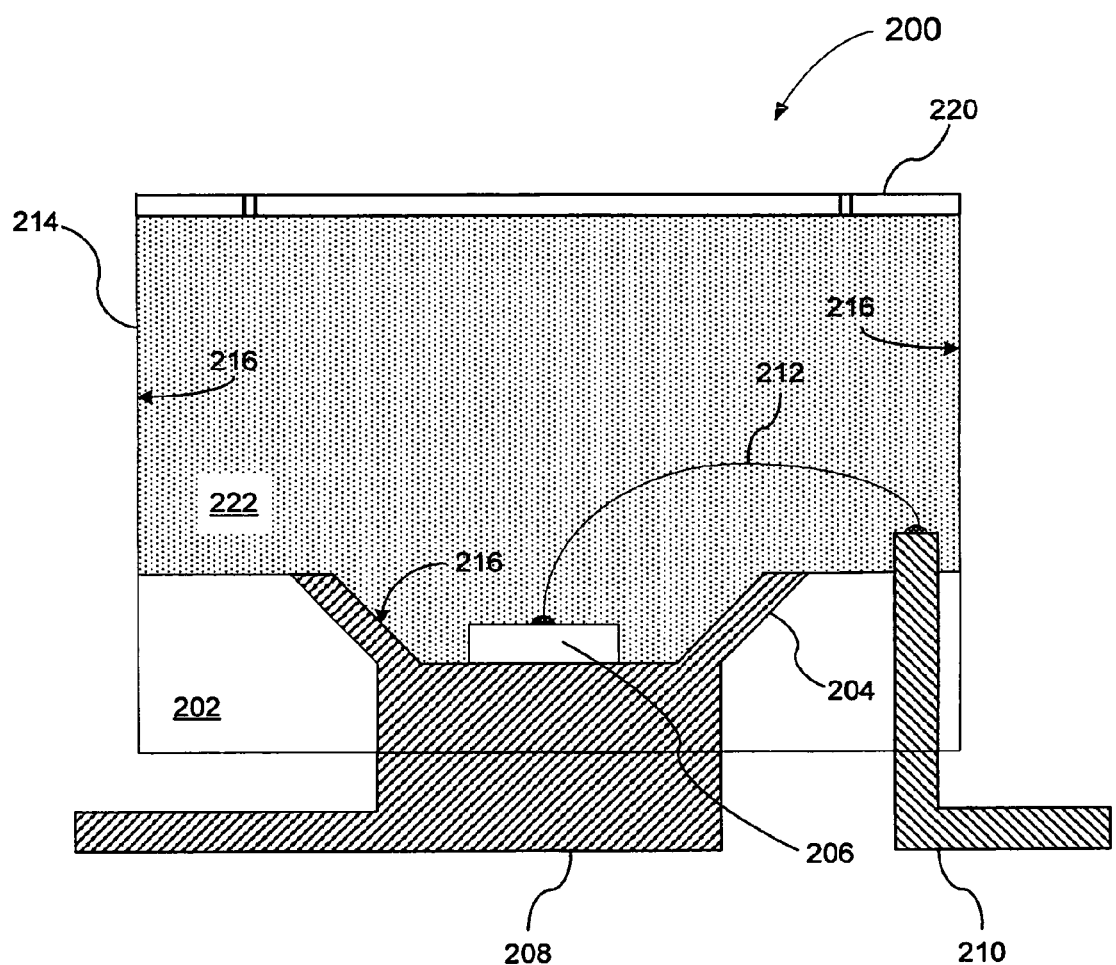
FIG. 2 shows a cross-sectional side view illustrating another example of an implementation of a light emitting device utilizing a metal can package to house a light source and that is hermetically sealed and may be filled with an inert, heat-conducting gas or liquid.

In FIG. 2, a cross-sectional side view illustrating another example of an implementation of a light emitting device that utilizes a metal can package to house a light source, wherein the metal can package is hermetically sealed, is shown. The light emitting device incorporating a hermetically sealed package ("LED-HSP") 200 includes a substrate body 202 having a concave base cavity 204 in which a light emitting device 206, such as an LED, may be placed. As in FIG. 1, the substrate body 202 may be a metal base that may function as a heat sink and may also include the concave base cavity 204 that supports the light source 206.

The LED-HSP 200 may also include a mount lead 208 and an inner lead 210, with the concave base cavity 204 being supported by the mount lead 208. In FIG. 2, the light source 206 may be a surface mount assembly in which case, the electrical connection to the light emitting device 106 may be made by wire bonding 212 with a conformal coat for an electrical connection to the inner lead 210. A second electrical connection may then be located on the bottom surface of the LED 206, in the form of backside metallization (not shown), which may be implemented by attaching a conducting material to the bottom of light source 206.

As in FIG. 1, the substrate 202, the concave base cavity 204, and the light emitting device 206 are positioned at the bottom of a metal can package 214, which may include any of the following metal can packages: TO-3, TO-5, TO-8, TO-18, TO-39, TO-46, TO-52, TO-56, TO-66, TO-71, TO-72, TO-78, TO-99, TO-100, TO-237, and TO-257. In addition, the interior surfaces 216 of the metal can package 214 may be coated with a high-reflective material, such as silver, gold, sputtered aluminum, nickel-palladium, or other similar materials.

At the top of the LED-HSP 200, an optically-transparent cover 220 is positioned along the top of the metal can package 214. The optically-transparent cover 120 may be made of glass or any polymeric transparent substrate, and may also have a metal rim. Together, the optically-transparent cover 220, the metal can package 214, and the substrate body 202 may form an enclosed space that may be hermetically sealed. An inert, heat-conducting gas 222 may be injected into the enclosed space formed by the optically-transparent cover 220, the metal can package 214, and the substrate 202.

Figure 3:
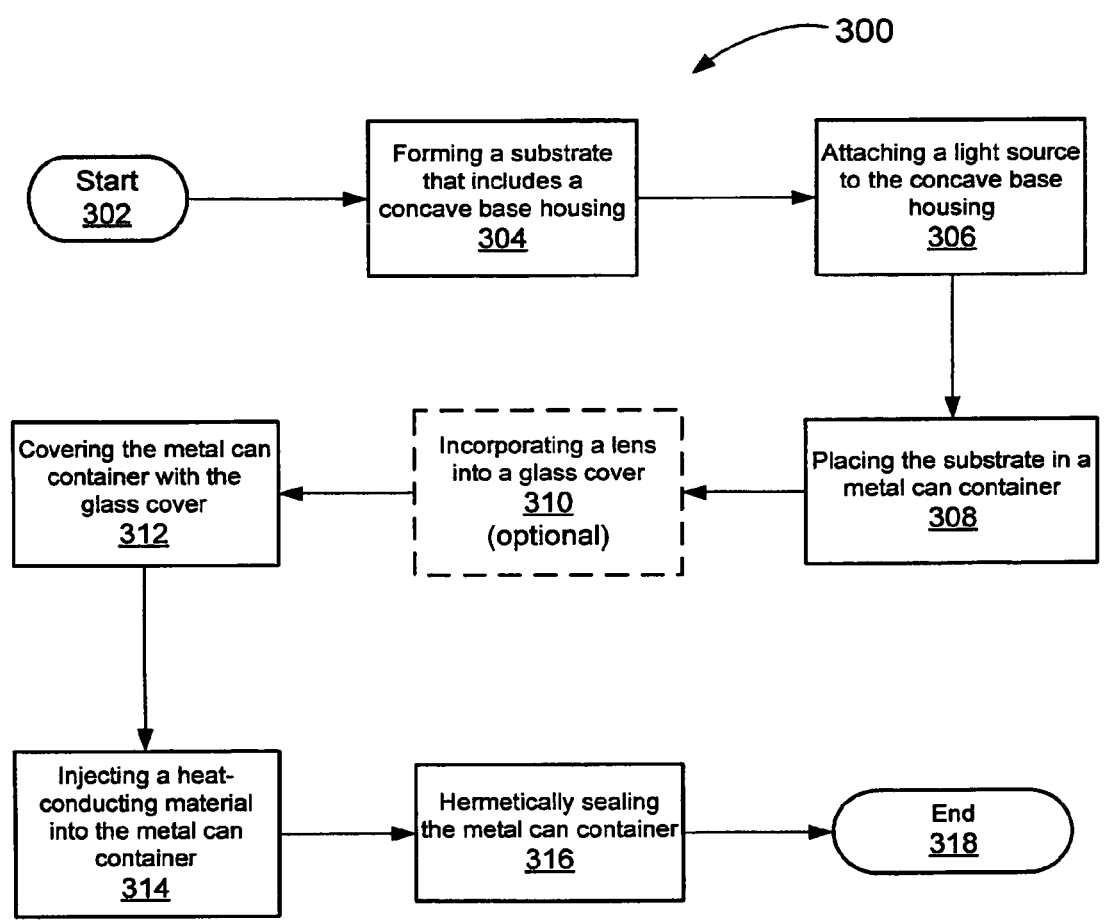
FIG. 3 shows a flow diagram illustrating an example of a process for producing a light emitting device having an hermetically sealed package with a light source encapsulated in an inert, heat-conducting gas or liquid as shown in FIGS. 1 and 2.

FIG. 3 is a flowchart showing an example of a process 300 of producing a light emitting device having an hermetically-sealed package for improved heat dissipation properties. The process starts at step 302, and in step 304, a substrate is formed that may include a concave base cavity. In step 306, a light source, for example, an LED, is attached to the concave base cavity. The substrate with the attached light source is then placed in a metal can container, which may be any of the types described above, in step 308. In optional step 310, a lens, which may be a dome-shaped or convex lens or a Fresnel lens, is incorporated into an optically-transparent cover, which may be a glass cover that includes a metal ring.

In step 312, the metal can container is covered with the glass cover. The substrate, the metal can container, and the glass cover form an enclosed space, and in step 314, an inert, heat-conducting material is injected into this enclosed space. The inert, heat-conducting material may be either a gas or a liquid. In step 316, the metal can container is hermetically sealed. The process then ends in step 318.

It is appreciated by those skilled in the art that the sequence of steps in the process 300 may be changed. As an example, steps 312 and 314 may be carried out simultaneously or with step 314 preceding step 312, with the end result being an hermetically-sealed metal can container with the heat-conducting gas or liquid filling the desired volume in the package. Also, if optional step 310 is omitted in the process, a lens may be attached to the glass cover after various steps in the process 300, for example, after either step 312 or step 316.

In an example of operation, when the light emitting device is in operation, i.e., a electrical connection is made to the light source, heat generated by the light source is dissipated by the metal can container via the heat-conducting material, which transmits the heat to the inner surfaces of the metal can container, where the heat is dissipated through the sides of the metal container, while the emitted light is reflected by the high-reflective material coated on the inner surface of the metal can container.

While the foregoing description refers to the use of an LED, which may include a blue-light-emitting diode or an UV diode, the subject matter is not limited to such a device as a light source. Any semiconductor radiation source that could benefit from the functionality provided by the components described above may be implemented as the light source, including semiconductor laser diodes. Additionally, the components described above may be implemented in an array with multiple light emitting devices interconnected and capable of being configured to add additional light emitting devices.

Moreover, it will be understood that the foregoing description of numerous implementations has been presented for purposes of illustration and description. This description is not exhaustive and does not limit the claimed inventions to the precise forms disclosed. Modifications and variations are possible in light of the above description or may be acquired from practicing the invention. The claims and their equivalents define the scope of the invention.

What is claimed:

1. A light emitting device having an hermetically-sealed package ("LED-HSP") for heat dissipation, the light emitting device comprising:
    a metal can having an interior surface and an open top;
    a metal base having a concave base cavity connected to said metal can;
    a semiconductor radiation source positioned in the concave base cavity of said metal base;
    an optically-transparent cover that covers the open top of the metal can and forms the hermetically-sealed package with the metal can, the hermetically sealed package forming an enclosed space above the metal base;
    a light pipe assembly positioned between the optically-transparent cover and the semiconductor radiation source, configured to transmit emitted light from the semiconductor radiation source to the optically-transparent cover; and
    a heat-conducting material comprising an inert gas or liquid material that fills the enclosed space of the hermetically-sealed package between the interior surface of the metal can and the light pipe assembly.

2. The LED-HSP of claim 1, wherein the semiconductor radiation source is a light-emitting diode ("LED").

3. The LED-HSP of claim 2 further including a bead of an optical gel applied over the LED.

4. The LED-HSP of claim 1, wherein the metal can is selected from a group consisting of metal can packages TO-3, TO-5, TO-8, TO-18, TO-39, TO-46, TO-52, TO-56, TO-66, TO-71, TO-72, TO-78, TO-99, TO-100, TO-237, and TO-257.

5. The LED-HSP of claim 4, wherein the interior surface of the metal can is coated with a reflective material selected from a group consisting of plated silver, plated gold, polished aluminum, sputtered aluminum, and polished nickel.

6. The LED-HSP of claim 5, further including a dome-shaped or Fresnel lens that is incorporated into or attached to the optically-transparent cover.

7. The LED-HSP of claim 1, wherein the inert gas or liquid material is a gas selected from a group consisting of Freon, argon, xenon, and nitrogen or a liquid selected from a group consisting of de-ionized water or silicone gel.

8. The LED-HSP of claim 1, wherein the semiconductor radiation source includes at least one additional LED.

9. The LED-HSP of claim 1, wherein the light pipe assembly comprises a solid device having a reflective material applied on an exterior surface thereof.

10. The LED-HSP of claim 1, wherein the light pipe assembly comprises a device having an interior surface with a reflective material applied thereon.

11. A method of producing a light-emitting device having a hermetically-sealed package for heat dissipation, the method comprising:
    forming a substrate that includes a base cavity;
    attaching a light source to the base cavity;

placing the substrate in a metal can container having an interior surface and an open top;

placing a light pipe assembly within the metal can container over the light source;

covering the open top of the metal can container and the light pipe assembly with an optically-transparent cover injecting a heat-conducting material comprising an inert gas or liquid material into the metal can container between the interior surface of the metal can container and the light pipe assembly; and hermetically sealing the metal can container.

12. The method of claim 11, wherein the inert gas or liquid material is a gas selected from a group consisting of Freon, argon, xenon, and nitrogen or a liquid selected from a group consisting of de-ionized water or silicone gel.

13. The method of claim 11, further including coating the inner surface of the metal can container with a reflective coating.

14. The method of claim 13, wherein the reflective material is selected from a group consisting of plated silver, plated gold, polished aluminum, sputtered aluminum, and polished nickel.

15. The method of claim 11, wherein the light pipe assembly comprises a solid device having a reflective material applied on an exterior surface thereof.

16. The method of claim 11, wherein the light pipe assembly comprises a device having an interior surface with a reflective material applied thereon.

* * * * *